United States Patent
Li et al.

(10) Patent No.: US 12,463,612 B2
(45) Date of Patent: Nov. 4, 2025

(54) PI-TYPE NOISE FILTER DISPOSED WITHIN A CASE AND INCLUDING FIRST AND SECOND PARTITIONS WITH A GAP THEREBETWEEN THAT ARE INTERPOSED BETWEEN STAGES OF THE FILTER

(71) Applicant: Hitachi Astemo, Ltd., Hitachinaka (JP)

(72) Inventors: Jia Li, Tokyo (JP); Aya Tooyama, Tokyo (JP); Hirofumi Shimizu, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 442 days.

(21) Appl. No.: 17/924,392

(22) PCT Filed: Mar. 10, 2021

(86) PCT No.: PCT/JP2021/009695
§ 371 (c)(1),
(2) Date: Nov. 10, 2022

(87) PCT Pub. No.: WO2021/229908
PCT Pub. Date: Nov. 18, 2021

(65) Prior Publication Data
US 2023/0299734 A1  Sep. 21, 2023

(30) Foreign Application Priority Data
May 12, 2020 (JP) .................. 2020-083659

(51) Int. Cl.
*H03H 1/00* (2006.01)
*H02M 1/44* (2007.01)
(Continued)

(52) U.S. Cl.
CPC ............ *H03H 1/0007* (2013.01); *H02M 1/44* (2013.01); *H02M 7/48* (2013.01); *H03H 7/01* (2013.01);
(Continued)

(58) Field of Classification Search
CPC ...................................... H03H 1/007
(Continued)

(56) References Cited

U.S. PATENT DOCUMENTS 3,909,623 A * 9/1975 Wagner ................ H03H 1/0007
333/182

FOREIGN PATENT DOCUMENTS

GB  2 310 553 A  8/1997
JP  H8-237936 A  9/1996
(Continued)

OTHER PUBLICATIONS

International Search Report with English Translation and Written Opinion dated Apr. 20, 2021 in corresponding International Application No. PCT/JP2021/009695.

*Primary Examiner* — Benny T Lee
(74) *Attorney, Agent, or Firm* — Foley & Lardner LLP

(57) ABSTRACT

Provided is a filter device including a π-type noise filter, and a metal case in which a first ground point and a second ground point are formed. The π-type noise filter includes a magnetic core configured to surround a direct current wiring, a first capacitor disposed in a stage preceding the magnetic core, a second capacitor disposed in a stage subsequent to the magnetic core, each of the first capacitor and the second capacitor connected to a corresponding one of the first ground point and the second ground point. A first partition and a second partition opposing each other are formed between the first ground point and the second ground point, and the first partition and the second partition have a
(Continued)

(a)

(b)

predetermined gap between each other. Provided is a power conversion device including the filter device and a power conversion unit.

4 Claims, 9 Drawing Sheets

(51) Int. Cl.
*H02M 7/48* (2007.01)
*H03H 7/01* (2006.01)
*B60L 15/00* (2006.01)
*H02M 1/12* (2006.01)

(52) U.S. Cl.
CPC ............ *B60L 15/007* (2013.01); *H02M 1/123* (2021.05); *H02M 1/126* (2013.01)

(58) Field of Classification Search
USPC ........................................................ 333/181
See application file for complete search history.

(56) References Cited

FOREIGN PATENT DOCUMENTS

| JP | 2004-088936 A | 3/2004 |
|----|---------------|--------|
| JP | 2009-240037 A | 10/2009 |
| JP | 2015-144509 A | 8/2015 |
| JP | 2017-118387 A | 6/2017 |

* cited by examiner

PI-TYPE NOISE FILTER DISPOSED WITHIN A CASE AND INCLUDING FIRST AND SECOND PARTITIONS WITH A GAP THEREBETWEEN THAT ARE INTERPOSED BETWEEN STAGES OF THE FILTER

TECHNICAL FIELD

The present invention relates to a filter device and a power conversion device.

BACKGROUND ART

As a countermeasure against conductive noises caused by leakage current, a power conversion device mounted in a hybrid automobile or an electric automobile is required to satisfy an original standard that each automobile manufacturer has established based on a high voltage conductive noise standard additionally included in an international standard. Concurrently, in response to development of the electric automobile in which the power conversion device is mounted, the power conversion device needs to meet an increasing demand for smaller size and lower cost. Accordingly, a filter device included in the power conversion device is strongly required to improve radio frequency noise reduction performance, as well as to meet the demand for smaller size and lower cost.

As a background art of the present invention, there is known PTL 1 as follows. PTL 1 discloses a noise filter configured to include an additional switch such that interline capacitors connected to an input side and an output side of a common choke coil are spaced from a ground capacitor. PTL 2 discloses a device configured to intentionally use capacitance parasitic to an insulation board where a power semiconductor is mounted, so that an inductor and a parallel resonator are formed. With this configuration, electromagnetic field radiation caused by a common mode current is less prone to occur.

CITATION LIST

Patent Literature

PTL 1: JP 2017-118387 A
PTL 2: JP 2004-088936 A

SUMMARY OF INVENTION

Technical Problem

The technique disclosed in PTL 1 is provided by a component additionally included in the noise filter. Here, with the noise filter, the radio frequency noise reduction performance is improved, while the demand for smaller size and lower cost is not met. Further, with the technique disclosed in PTL 2, the radio frequency noise reduction performance is not significantly improved and thus, the device may not meet the requirement of the high voltage conductive noise standard.

In view of the respects described above, an object of the present invention is to provide a filter device and a power conversion device where the radio frequency noise reduction performance is improved; and concurrently the filter device and the power conversion device meet the demand for smaller size and lower cost.

Solution to Problem

A filter device of the present invention includes a π-type noise filter, and a metal case in which a first ground point and a second ground point are formed. The π-type noise filter includes: a magnetic core configured to surround a direct current wiring including a positive electrode wiring and a negative electrode wiring; a first capacitor disposed in a stage preceding the magnetic core and connected to the direct current wiring; and a second capacitor disposed in a stage subsequent to the magnetic core and connected to the direct current wiring, each of the first capacitor and the second capacitor connected to a corresponding one of the first ground point and the second ground point. A first partition and a second partition opposing each other are formed between the first ground point and the second ground point in the metal case, and the first partition and the second partition have a predetermined gap between each other. A power conversion device includes the filter device and a power conversion unit configured to convert a direct current voltage to an alternating current voltage, the direct current voltage introduced by the filter device.

Advantageous Effects of Invention

The present invention provides a filter device and a power conversion device where a radio frequency noise reduction performance is improved, and concurrently the filter device and the power conversion device meet a demand for smaller size and lower cost.

DESCRIPTION OF EMBODIMENTS

Figure 1:
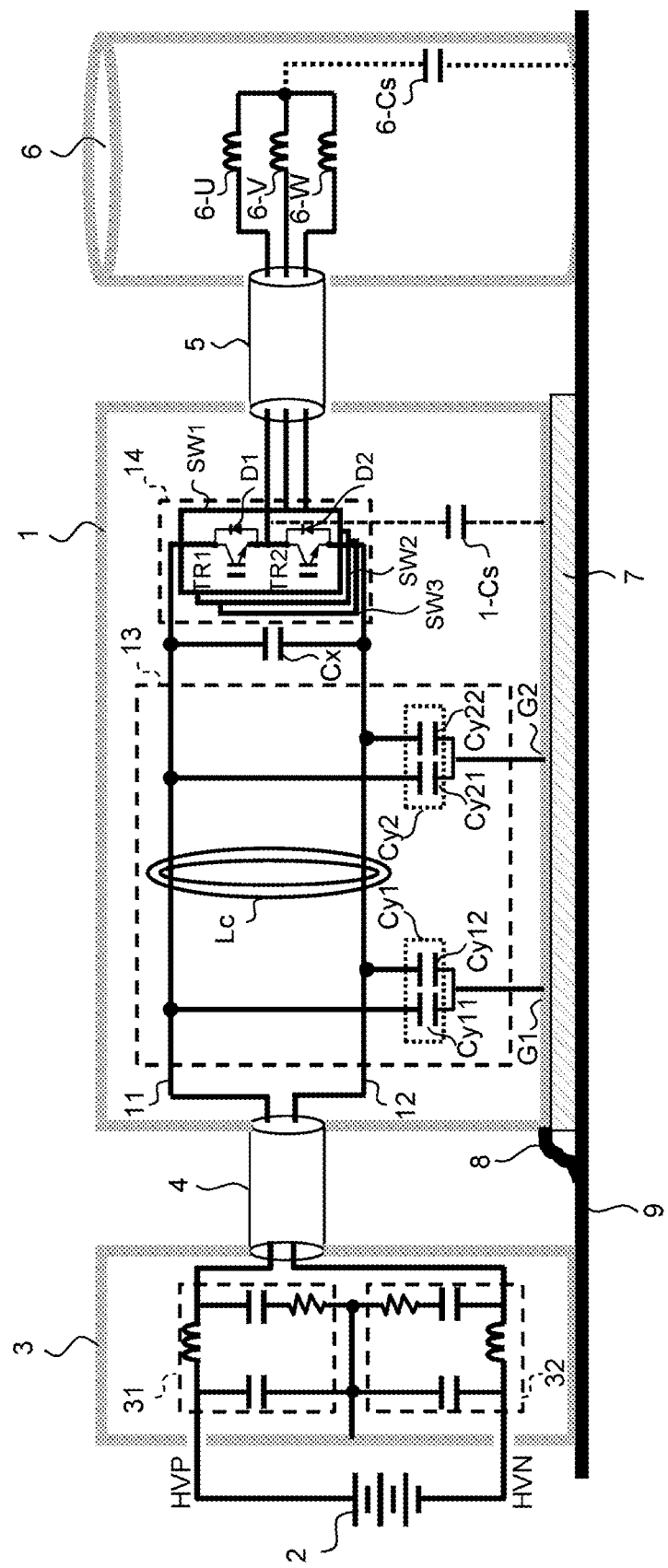
FIG. 1 is a block diagram illustrating a configuration of a power conversion device.

An embodiment of the present invention will be described below with reference to the drawings. The embodiments are merely illustrative for convenience of describing the present invention, and are omitted or simplified as appropriate for clarification of the description. The present invention may be implemented in other various manners. Unless otherwise limited, each component may be singular or plural. A position, size, shape, range, or the like of each component illustrated in the drawings may not necessarily represent an actual position, size, shape, range, or the like, in order to facilitate understanding of the invention. Accordingly, the present invention is not necessarily limited to the position, size, shape, range, or the like disclosed in the drawings.

When a plurality of components have the same or similar functions, the same reference signs may be provided with respective subscripts in descriptions below. Concurrently, when these plurality of components are described without being distinguished, the subscripts may be omitted in the descriptions below.

(Configuration of Power Conversion Device)

FIG. 1 is a block diagram illustrating a configuration of a power conversion device according to the present invention.

A power conversion device 1 (hereinafter, referred to as an inverter 1) accommodates various circuit blocks and elements. The inverter 1 is connected to a high voltage battery 2 and an electric motor 6. The high voltage battery 2 supplies power of a direct current high voltage, and the electric motor 6 is driven by an alternating current voltage (hereinafter, also simply referred to as an "AC voltage") that the inverter 1 has converted from a direct current voltage (hereinafter, also simply referred to as a "DC voltage").

The inverter 1 includes a housing as a metal case. In conformity with CISPR25 as an international standard, the housing (metal case) is connected to a GND plane 9 via a GND strap 8 and is placed on an insulator 7 having a height of 5 mm.

The inverter 1 includes a switching circuit 14 configured to convert the DC voltage into the AC voltage. The switching circuit 14 includes three unit switching circuits, i.e., unit switching circuits SW1, SW2, and SW3, each having the same configuration as the others. The switching circuit 14 operates switching periodically between the unit switching circuits SW1, SW2, and SW3. The unit switching circuits SW1, SW2, and SW3 respectively include insulated gate bipolar transistors (hereinafter, referred to as transistors) TR1 and TR2, together with diodes D1 and D2. While not illustrated, the inverter 1 further includes a control circuit board configured to generate a control signal for the switching circuit 14.

The diode D1 is connected to the transistor TR1, between a collector and an emitter of the transistor TR1; and the diode D2 is connected to the transistor TR2, between a collector and an emitter of the transistor TR2. The collector of the transistor TR1 is electrically connected to a positive electrode wiring 11 as a direct current wiring, and similarly, the emitter of the transistor TR2 is electrically connected to a negative electrode wiring 12 as the direct current wiring (hereinafter, referred to as a DC wiring). The emitter of the transistor TR1 is connected to the collector of the transistor TR2. Connection nodes between the emitters and the collectors are each an output node, and the connection nodes are respectively connected from the unit switching circuits SW1, SW2, and SW3 to coils 6-U, 6-V, and 6-W of the electric motor 6 via a high voltage AC cable 5.

With the inverter 1, a flow of the control signal will be described. A switch control signal, which the control circuit board (not illustrated) has generated for the switching circuit 14, is supplied to gates of the transistors TR1 and TR2 in each of the unit switching circuits SW1 to SW3. With the switch control signal for the switching circuit 14, the transistors TR1 and TR2 are under switching control, so that the transistors TR1 and TR2 are complementarily switched on and off. When the transistors TR1 and TR2 are complementarily switched on and off, positive electrode voltage and negative electrode voltage are (in other words, the AC voltage is) periodically outputted to the output node.

Here, the transistors TR1 and TR2 are periodically switched on and off, causing the voltage in an output part of the switching circuit 14 to fluctuate. In this state, stray capacitance (parasitic capacitance) is generated between the switching circuit 14 and the housing of the inverter 1. In FIG. 1, the stray capacitance is shown as stray capacitance 1-Cs.

A line impedance stabilization network (LISN) 3 of high voltage power supply will be described. The high voltage battery 2 supplies the power to the inverter 1 via the line impedance stabilization network (LISN) 3 of high voltage power supply. The LISN 3 has a housing that includes a positive electrode LISN circuit unit 31 and a negative electrode LISN circuit unit 32. The positive electrode LISN circuit unit 31 is connected to a positive electrode terminal HVP of the high voltage battery 2, the negative electrode LISN circuit unit 32 is connected to a negative electrode terminal HVN of the high voltage battery 2, and all these are accommodated in a housing of metal. The housing of the LISN 3 is connected to the GND plane 9. The positive electrode LISN circuit unit 31 and the negative electrode LISN circuit unit 32 are electrically connected to the positive electrode wiring 11 and the negative electrode wiring 12 (as the DC wirings of the inverter 1) via a high voltage DC cable 4.

The electric motor 6 will be described. The electric motor 6 is a three-phase electric motor, and includes a rotor (not illustrated) and a stator (not illustrated). The electric motor 6 includes a housing that is connected to the GND plane 9. The electric motor 6 has the AC voltage in three phases (U-phase, V-phase, and W-phase), the AC voltage generated by the inverter 1 via the high voltage AC cable 5, supplied to three-phase coils 6-U, 6-V, and 6-W (as a U-phase coil, a V-phase coil, and a W-phase coil) arranged on the stator. With this configuration, the three-phase coils 6-U, 6-V, and 6-w respectively generate magnetic fields in accordance with the AC voltage in three phases, causing the rotor to rotate. In FIG. 1, stray capacitances 6-Cs corresponds to stray capacitance (parasitic capacitance) generated between the housing of the electric motor 6 and each of the three-phase coils 6-U, 6-V, and 6-w.

The inverter 1 includes, between the positive electrode wiring 11 and the negative electrode wiring 12, a smoothing capacitor Cx configured to smooth the DC voltage, and a CLC π-type noise filter 13. When the switching circuit 14 operates switching, the smoothing capacitor Cx suppresses ripple voltage or ripple current generated in the positive and negative electrode wirings 11 and 12 as DC wirings that function as bus bars connecting the DC voltage to the switching circuit 14.

The CLC π-type noise filter 13 includes a magnetic core Lc, a first ground capacitor Cy1, and a second ground capacitor Cy2. The magnetic core Lc surrounds the DC wiring including the positive electrode wiring 11 and the negative electrode wiring 12. The first ground capacitor Cy1 is connected to the DC wiring including the positive and negative electrode wirings 11 and 12 in a stage preceding the magnetic core Lc; and the second ground capacitor Cy2 is connected to the DC wiring including the positive and the negative electrode wirings 11 and 12 in a stage subsequent to the magnetic core Lc.

At a bottom of the housing of the inverter 1, a first ground point G1 and a second ground point G2 are arranged such that the positive electrode wiring 11 and the negative electrode wiring 12 are grounded. The first ground capacitor Cy1 includes a ground capacitor Cy11 and a ground capacitor Cy12. The ground capacitor Cy11 is connected between the positive electrode wiring 11 and the first ground point G1, and the ground capacitor Cy12 is connected between the negative electrode wiring 12 and the first ground point G1. Similarly, the second ground capacitor Cy2 includes a ground capacitor Cy21 and a ground capacitor Cy22. The ground capacitor Cy21 is connected between the positive electrode wiring 11 and the second ground point G2, and the ground capacitor Cy22 is connected between the negative electrode wiring 12 and the second ground point G2.

The CLC π-type noise filter 13 reduces noise of the DC high voltage supplied from the high voltage battery 2, and concurrently introduces the DC high voltage to the switching circuit 14 that functions as a power conversion unit. The noise is induced by a noise current that leaks to a power supply wiring or cable connected between the high voltage battery 2 and the inverter 1. The noise current is a common mode current flowing between the grounds.

At the switching operation where the transistors TR1 and TR2 are periodically switched on and off, ground voltage fluctuates, thereby generating the common mode current. Due to the fluctuation in voltage in the output part of the switching circuit 14, the common mode current flows between the housing of the inverter 1 and the housing of the electric motor 6, through the stray capacitance 1-Cs parasitic between the switching circuit 14 and the housing of the inverter 1 and through the stray capacitance 6-Cs existing between the three-phase coils 6-U, 6-V, and 6-W of the electric motor 6 and the housing of the electric motor 6. In this state, the high voltage conductive noise occurs. Thus, in order to reduce the high voltage conductive noise, the common mode current needs to be reduced. With the inverter 1, the CLC π-type noise filter 13 is configured to deal with the noise current as a main cause for the occurrence of the high voltage conductive noise, and configured to reduce the noise to meet the requirement of the high voltage conductive noise standard.

The high voltage conductive noise standard will be described. The noise standard specifies a regulation value generally within a frequency band from 0.15 MHz to 108 MHZ. The high voltage conductive noise standard is a standard additionally included in the CISPR 25 Ed4 as the international standard created by the International Special Committee on Radio Interference (CISPR) in October 2016. The high voltage conductive noise standard is particularly designed to regulate a noise in an FM broadcasting frequency band (76 MHz to 108 MHZ) used in a variety of applications such that the noise is lower than noises in the other frequency bands.

The high voltage conductive noise occurs as has been described above, and may cause malfunction of electrical and electronic systems in a vehicle. Accordingly, it is a requirement to measure an actual amount of the high voltage conductive noise occurring in the inverter 1 prior to shipment. Here, the actual amount of the high voltage conductive noise is required to be equal to or smaller than the regulation values specified by legal regulations of each country as well as customer requirements. In view of this, the inverter 1 includes the CLC π-type noise filter 13 as an effective filter, with which the high voltage conductive noise is reduced to a level that meets the high voltage conductive noise standard.

Figure 2:
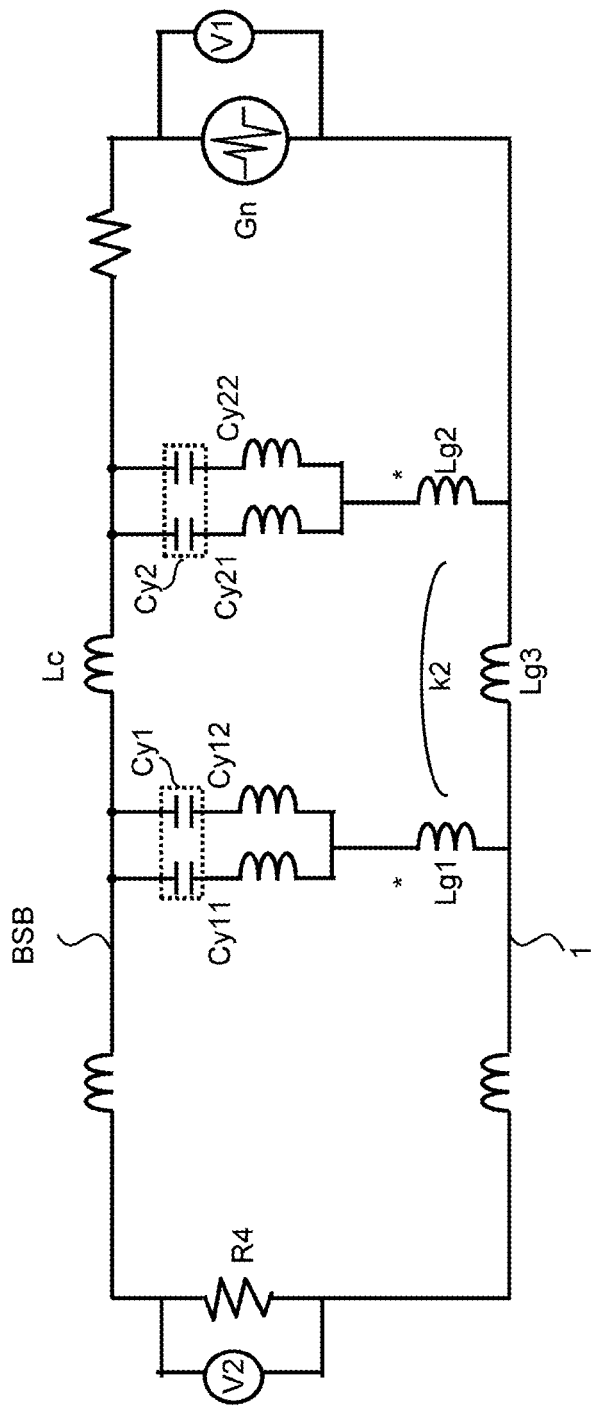
FIG. 2 is a circuit diagram illustrating an equivalent circuit of a π-type noise filter.

FIG. 2 is a circuit diagram illustrating an equivalent circuit of a π-type noise filter 13 according to a comparative example. FIG. 2 is an equivalent circuit diagram as the comparative example where the structure of the present invention is not applied to the π-type noise filter 13.

The equivalent circuit diagram of FIG. 2 is designed to calculate an insertion loss of the π-type noise filter, and the equivalent circuit includes the line impedance stabilization network (LISN) 3 of high voltage power supply and the switching circuit 14, each of which has been previously described.

A power supply Gn corresponds to a source of the AC voltage that simulates noise voltage occurring in the switching circuit 14, and V1 corresponds to a voltmeter for measuring voltage in the power supply Gn. Note that, in FIG. 1, the LISN 3 achieves equivalence using internal resistance in radio frequency band, and thus in FIG. 2, the LISN is illustrated as a resistor R4. V2 corresponds to a voltmeter for measuring voltage of the resistor R4.

In an inverter 1, a first ground capacitor Cy1 and a second ground capacitor Cy2 are electrically connected to a DC wiring BSB of the inverter 1. Here, in a case where the common mode noise current (as the main cause for the occurrence of the noise) flows, in the equivalent circuit, the first ground capacitor Cy1 and the second ground capacitor Cy2 are connected in parallel between the DC wiring and the housing. Thus, the equivalent circuit diagram illustrates each of the first ground capacitor Cy1 and the second ground capacitor Cy2 connected between the DC wiring and the housing.

In FIG. 2, Lc represents inductance of a magnetic core Lc. Inductors Lg1, Lg2, and Lg3 respectively indicate inductance between a ground point G1 and the housing of the inverter 1, inductance between a ground point G2 and the housing of the inverter 1, and inductance between the ground point G1 and the ground point G2. A mark "*" shown with each of the inductors Lg1 and Lg2 indicates a direction where the corresponding magnetic field is generated. Here, k2 represents a mutual coupling coefficient (hereinafter, simply referred to as a coupling coefficient k2) between the inductors Lg1 and Lg2. Note that, with regard to parasitic inductance of each of the wirings including wiring and cables in the LISN 3, parasitic inductance in lead wires of ground capacitor Cy11, 12, 21 and 22, and inductance in a path including the wiring from the housing of the inverter 1 to the LISN 3, an indication of each of these inductances is omitted.

Figure 3:
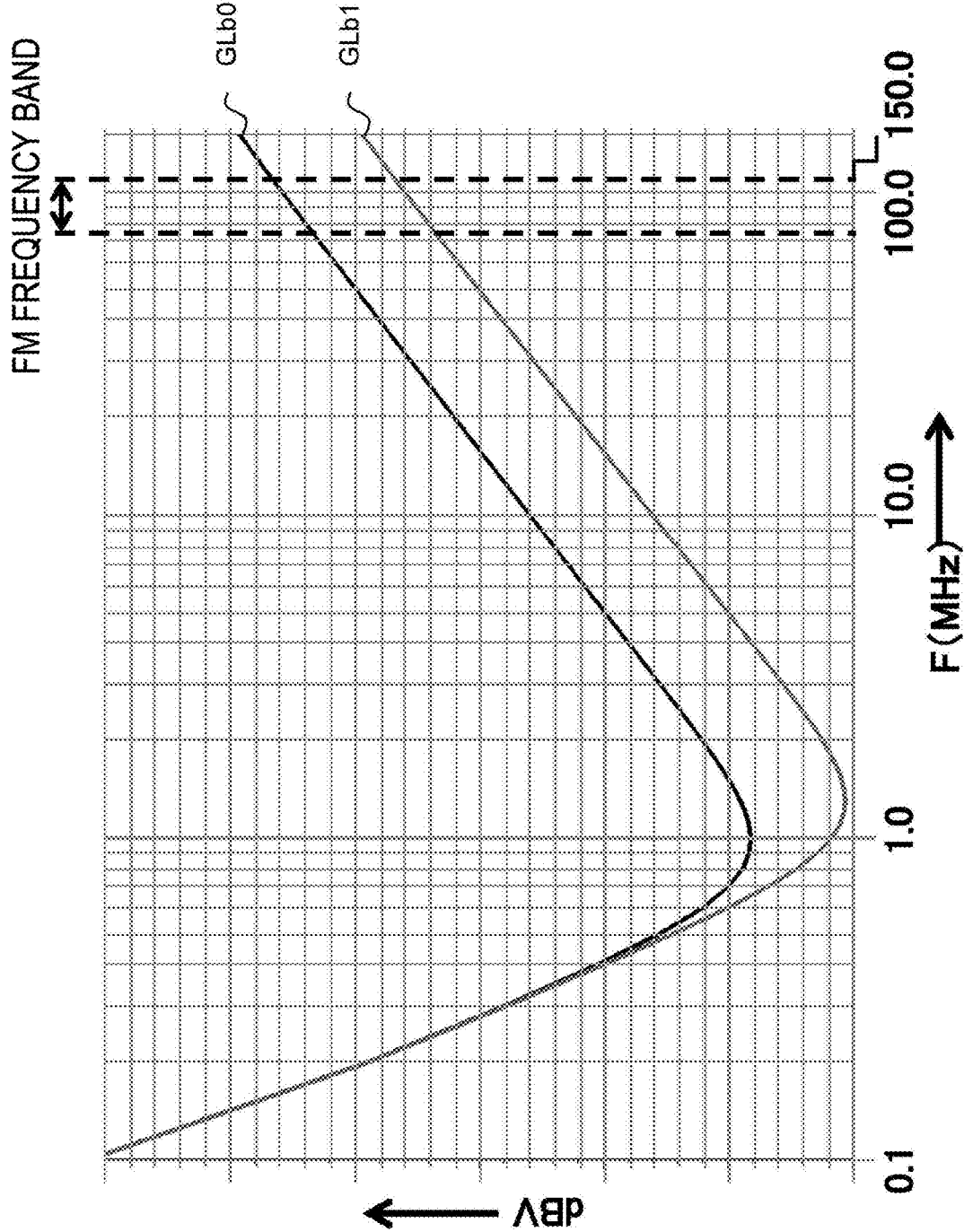
FIG. 3 is a diagram illustrating an insertion loss of the π-type noise filter.

FIG. 3 is a diagram illustrating an insertion loss when the π-type noise filter of FIG. 2 is made smaller. The horizontal axis represents a frequency F, and the vertical axis represents a ratio between the voltage measured by the V2 and the voltage measured by the V1 in FIG. 2, the ratio shown in decibels (dBV).

As has been described above, the π-type noise filter 13 is effective in reducing the common mode current. The reduction effect or the reduction performance is typically expressed by an insertion loss of a filter. The π-type noise filter 13 has a mechanism to reduce the common mode current, and in the mechanism, the first ground capacitor Cy1 and the second capacitor Cy2 are used to provide a low impedance path between the positive electrode wiring 11 and the GND plane 9 as well as between the negative electrode wiring 12 and the GND plane 9. With the mechanism, the common mode current is bypassed from the positive electrode wiring 11 and the negative electrode wiring 12 to the GND plane 9, leading to a reduction in the amount of the current that leaks to between the housing of the inverter 1 and the housing of the electric motor 6. Meanwhile, the current flowing in the low impedance path induces a magnetic flux, and the magnetic fluxes interlink with each other, thereby causing inductive coupling. The coupling coefficient k2 described above indicates a degree of the inductive coupling.

In FIG. 3, as the ratio between the voltages measured by V2 and V1 is smaller, the insertion loss of the filter is greater, which means that the noise reduction performance is improved. A characteristic curve GLb1 indicates a change in insertion loss when the coupling coefficient k2 between the inductors Lg1 and Lg2 equals 0.08, the change in insertion loss in response to a change in the frequency F. Concurrently, a characteristic curve GLb0 indicates a change in insertion loss when, due to the smaller size of the power conversion device, the ground point G1 and the ground point G2 are brought closer to each other, and when the coupling coefficient k2 between the inductors Lg1 and Lg2 equals 0.256. Here, the other parameters for circuit elements than the coupling coefficient k2 (used to obtain the characteristic curves GLb0 and GLb1) are the same.

As illustrated in FIG. 3, the ratio between the voltages measured by V2 and V1 is greater in the characteristic curve GLb1 (where the coupling coefficient k2 between the inductors Lg1 and Lg2 equals 0.256) than in the characteristic curve GLb1 (where the coupling coefficient k2 equals 0.08). Here, when the ground point G1 and the ground point G2 are spaced apart from each other, the inductive coupling is extremely weak, and the coupling coefficient k2 is thus reduced to 0.1 or below. With the inverter 1 of smaller size, the first ground capacitor Cy1 and the second ground capacitor Cy2 are brought closer to each other in the π-type noise filter 13, so that the coupling coefficient k2 is increased. As seen here, with the π-type noise filter 13 of smaller size in response to the inverter 1 of smaller size, the insertion loss of the filter in the radio frequency band (including the FM broadcasting frequency band) is smaller, which means that the noise reduction performance is degraded.

Accordingly, the present invention provides a structure below, as will be described in each of the embodiments. With the structure, even when the π-type noise filter 13 is made smaller, the insertion loss of the filter in the radio frequency band is less prone to be smaller, so that the noise reduction performance is less prone to be degraded.

First Embodiment

Figure 4:
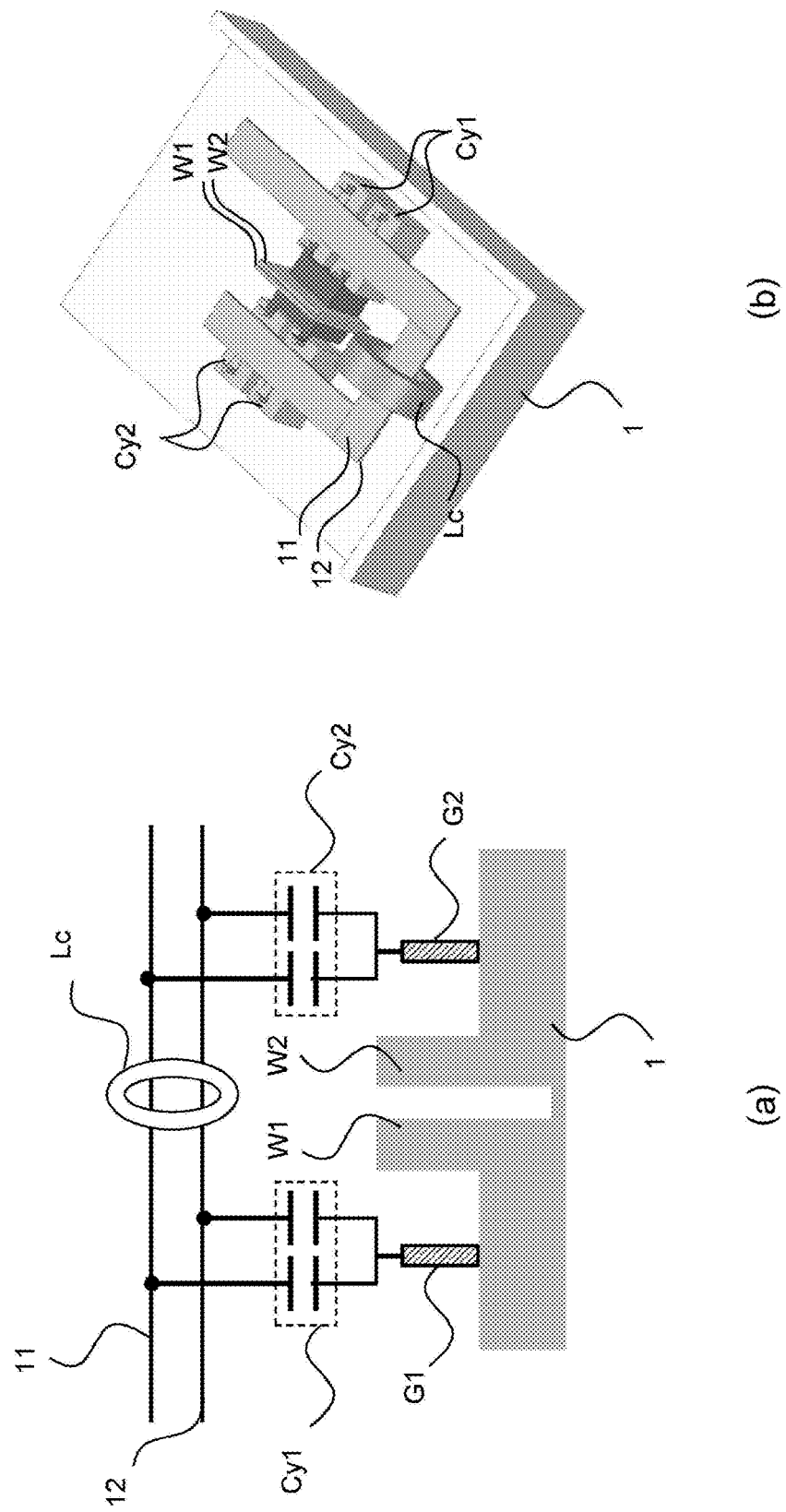
FIG. 4 is a diagram illustrating a structure of a π-type noise filter according to a first embodiment of the present invention.

FIG. 4 is a diagram illustrating a structure of a π-type noise filter 13 according to a first embodiment of the present invention. FIG. 4(a) is a diagram illustrating an outline of the structure of the π-type noise filter 13 according to the first embodiment of the present invention. FIG. 4(b) is a perspective view of the π-type noise filter 13 according to the first embodiment of the present invention, and illustrates an example of a three-dimensional structure of the π-type noise filter 13.

As illustrated in FIGS. 4(a) and 4(b), in this embodiment, at a bottom of a housing of an inverter 1, a partition W1 and a partition W2 oppose each other between a ground point G1 and a ground point G2, the partition W1 and the partition W2 having a predetermined gap therebetween. Among circuit blocks and components accommodated in the housing of the inverter 1, FIGS. 4(a) and 4(b) illustrate only a positive electrode wiring 11 as a DC wiring, a negative electrode wiring 12 as the DC wiring, a magnetic core Lc, a first ground capacitor Cy1, and a second ground capacitor Cy2, and omits the other blocks and components.

As illustrated in FIG. 4, the π-type noise filter 13 of this embodiment includes the first partition W1 and the second partition W2 opposing each other. The first partition W1 and the second partition W2 may be manufactured by cutting a housing of conductive metal, or may be integrally formed with the housing when the housing is formed by casting.

Figure 5:
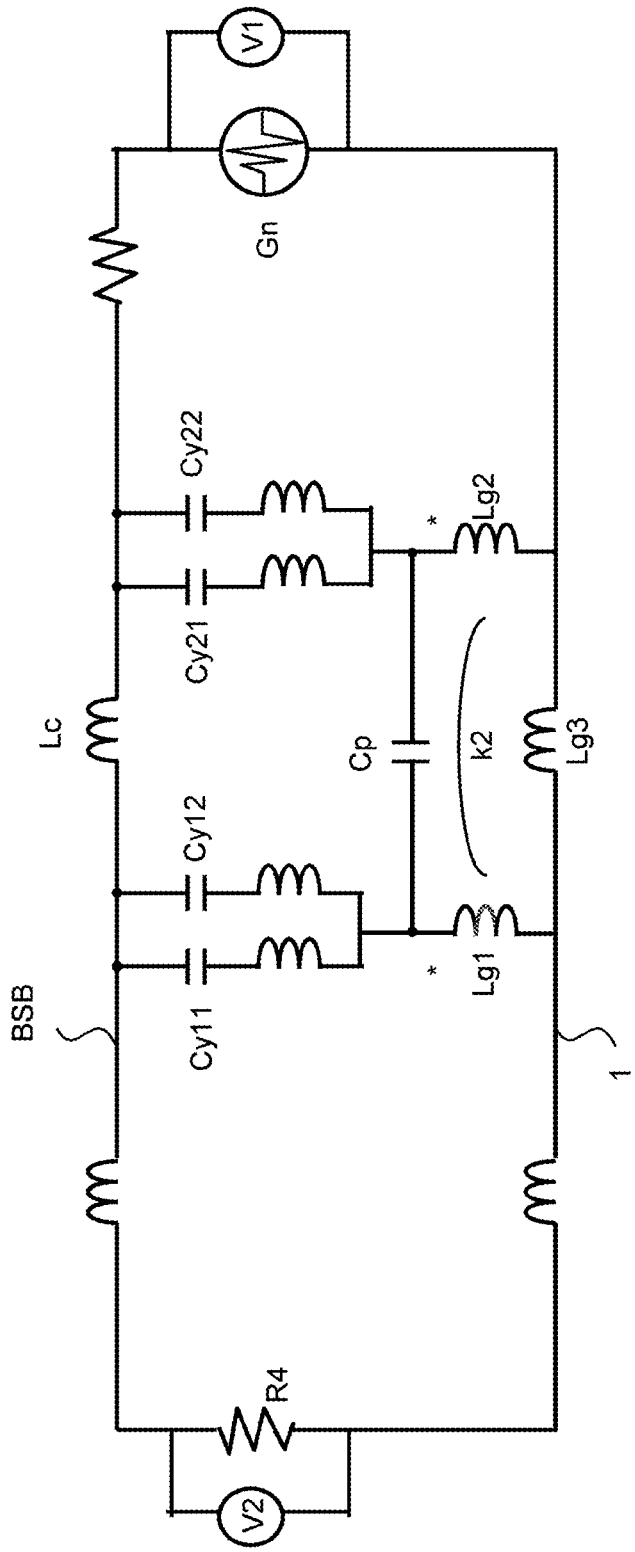
FIG. 5 is a circuit diagram illustrating an equivalent circuit of the π-type noise filter of FIG. 4.

FIG. 5 is a circuit diagram illustrating an equivalent circuit of the π-type noise filter of FIG. 4 and according to the first embodiment of the present invention. Similarly to FIG. 2, the equivalent circuit diagram of FIG. 5 is designed to calculate an insertion loss of the noise filter, and stray capacitance Cp is stray capacitance parasitic between the first partition W1 and the second partition W2. Here, other circuit elements and the details of the circuit diagram are the same as those in FIG. 2.

As illustrated in FIG. 5, with the partition W1 and the partition W2 provided here, the parasitic capacitance between the partitions W1 and W2 is intentionally used such that parasitic inductances (the inductors) Lg1, Lg2, and Lg3 along the ground are formed with a parallel resonator. With this configuration, the noise reduction performance of the π-type noise filter is improved.

Figure 6:
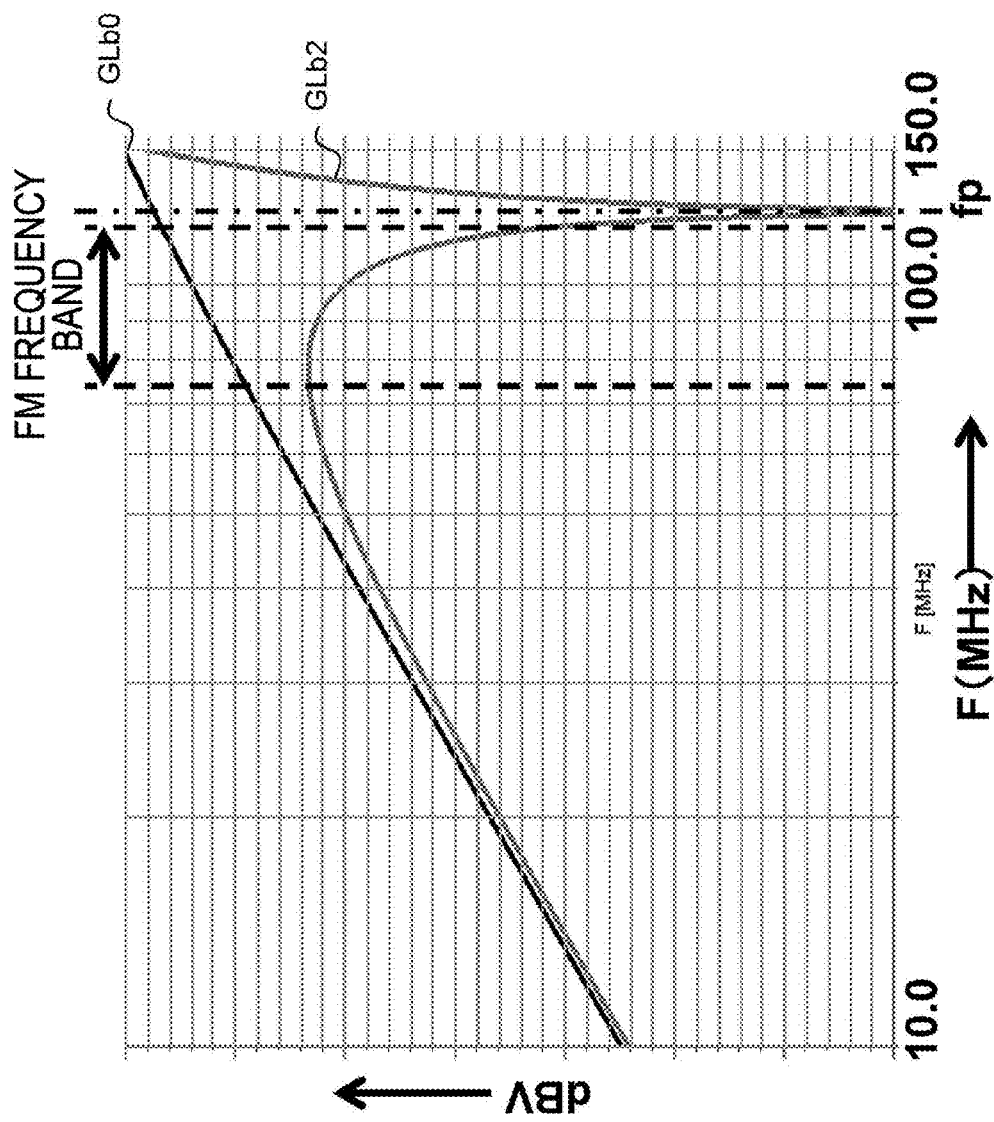
FIG. 6 is a diagram illustrating an insertion loss of the π-type noise filter of FIG. 5.

FIG. 6 is a diagram illustrating an insertion loss of the π-type noise filter of FIG. 5. In FIG. 6, similarly to FIG. 3, the horizontal axis represents the frequency F, and the vertical axis represents the ratio between the voltage measured by V2 of FIG. 5 and the voltage measured by V1 of FIG. 5, the ratio shown in decibels (dBV). Here, as the ratio between the voltages measured by V2 and V1 is smaller, the insertion loss of the filter is greater, which means that the noise reduction performance is improved.

A characteristic curve GLb2 indicates a change in insertion loss when the stray capacitance CP parasitic between the partitions W1 and W2 equals 50 pF, the change in insertion loss in response to a change in the frequency F. Concurrently, a characteristic curve GLb0 indicates a change in insertion loss when the stray capacitance CP parasitic between the partitions W1 and W2 does not exist (similarly to the characteristic curve GLb0 in FIG. 3). Here, the other parameters for circuit elements than the stray capacitance Cp (used to obtain the characteristic curves GLb0 and GLb2) are the same.

As has been described above, the stray capacitance Cp parasitic between the partitions is intentionally used such that parasitic inductances along the path from the first ground point G1 to the second ground point G2 are formed with the parallel resonator. With this configuration, the noise reduction performance in the radio frequency band is improved. A resonance frequency fp is expressed by a formula (1).

[Mathematical formula 1]

$$f_p = \frac{1}{2\pi\sqrt{Cp(L_{g1} + L_{g2} + L_{g3} - 2*k2\sqrt{L_{g1}L_{g2}})}} \quad (1)$$

In the formula (1), as has been described above, the stray capacitance Cp represents the stray capacitance parasitic between the partitions W1 and W2, each of Lg1, Lg2, and Lg3 represents the parasitic inductance along the path from the first ground point G1 to the second ground point G2, and k2 represents the coupling coefficient between the inductors Lg1 and Lg2.

As expressed by the formula (1), the resonance frequency fp is obtained based on values of the stray capacitance Cp as well as the parasitic inductances Lg1, Lg2, and Lg3. The value of the stray capacitance Cp may be adjusted based on a distance between the partitions W1 and W2, the area of each of the surfaces of the partitions W1 and W2, the surfaces opposing each other, or dielectric constant between the partitions W1 and W2. Accordingly, it is possible to shift the resonance frequency fp to a frequency band where the noise reduction performance of the filter needs to be improved.

In other words, in the configuration where the partitions W1 and W2 are arranged at the bottom of the housing of the inverter 1, the values of the stray capacitance Cp and the parasitic inductances are adjusted such that the noise reduction performance is maximized in the specific frequency band. As a result, the inverter 1 meets the demand for smaller size, and concurrently does not need any additional component. Further, this configuration allows, at a stage of design of the product, a preliminary design where the noise reduction performance is maximized. Accordingly, the filter device meets the demand for smaller size and lower cost, so that the power conversion device meets the demand for smaller size and lower cost.

The configurations in the first embodiment of the present invention described above are effective as follows.
(1) The filter device includes the π-type noise filter 13, and the metal case 1 in which the first ground point G1 and the second ground point G2 are formed. The π-type noise filter 13 includes: the magnetic core Lc configured to surround the DC wiring including the positive electrode wiring 11 and the negative electrode wiring 12; the first capacitor Cy1 disposed in the stage preceding the magnetic core Lc and connected to the DC wiring including the positive and negative electrode wirings 11 and 12; and the second capacitor Cy2 disposed in the stage subsequent to the magnetic core Lc and connected to the DC wiring including the positive and negative electrode wirings 11 and 12. Each of the first capacitor Cy1 and the second capacitor Cy2 is connected to the corresponding one of the first ground point G1 and the second ground point G2. A first partition W1 and a second partition W2 opposing each other are formed between the first ground point G1 and the second ground point G1 in the metal case, and the first partition W1 and the second partition W2 have the predetermined gap between each other. With this configuration, the filter device improves the radio frequency noise reduction performance, and concurrently meets the demand for smaller size and lower cost.
(2) The power conversion device includes the filter device, and the power conversion unit configured to convert the DC voltage to the AC voltage, the DC voltage introduced by the filter device. With this configuration, the power conversion device includes the filter device, with which the radio frequency noise reduction performance is improved, and meets the demand for smaller size and lower cost.

Second Embodiment

Figure 7:
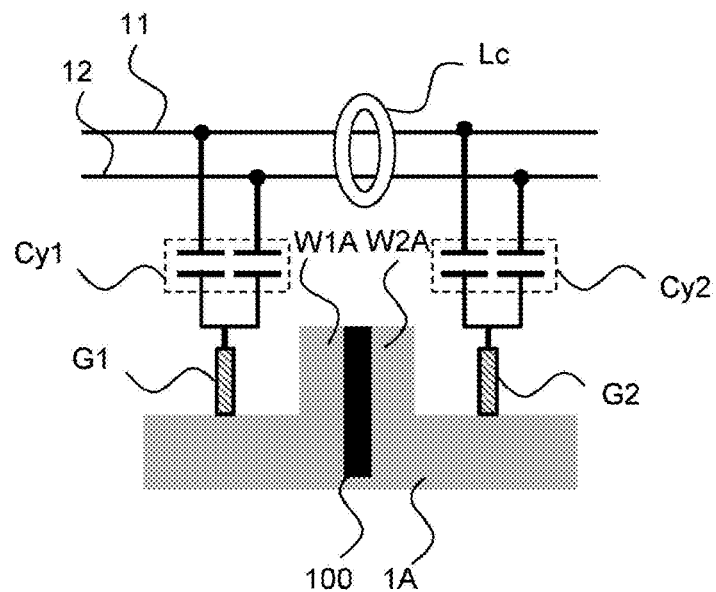
FIG. 7 is a diagram illustrating a structure of a π-type noise filter according to a second embodiment of the present invention.

FIG. 7 is a diagram illustrating a structure of a π-type noise filter 13 according to a second embodiment of the present invention.

In this embodiment, an inverter 1A has a structure where a first partition W1A and a second partition W2A oppose each other and have an insulation member 100 interposed therebetween. The insulation member 100 is a dielectric, such as a resin member. The insulation member 100 is higher in dielectric constant than air, so that stray capacitance parasitic between the first partition W1A and the second partition W2A has a greater variable range than when the partitions W1A and W2A do not have the insulation member 100 interposed therebetween. Additionally, the formula (1) may be applied to adjust the values of the stray capacitance Cp and the parasitic inductance, thereby causing the variable range of the stray capacitance to be even greater, and further causing the variable range of the resonance frequency fp to be greater.

The configuration described above allows more freedom of design. For example, the dielectric 100 arranged between the partitions W1A and W2A may be previously and integrally embedded with a metal housing 1A or may be additionally inserted. The insulation member 100 is still applicable even when formed of other materials than resin.

The configurations in the second embodiment of the present invention described above are effective as follows.
(3) The filter device includes the insulation member 100 between the first partition W1A and the second partition W2A. With this configuration, it is possible to improve the noise reduction performance of the π-type noise filter, compared with when the filter device does not include the insulation member 100.

Third to Six Embodiments

Each of FIGS. 8, 9, 10, and 11 is a diagram illustrating a structure of a π-type noise filter according to a corresponding one of third, fourth, fifth, and sixth embodiments of the present invention.

Figure 8:
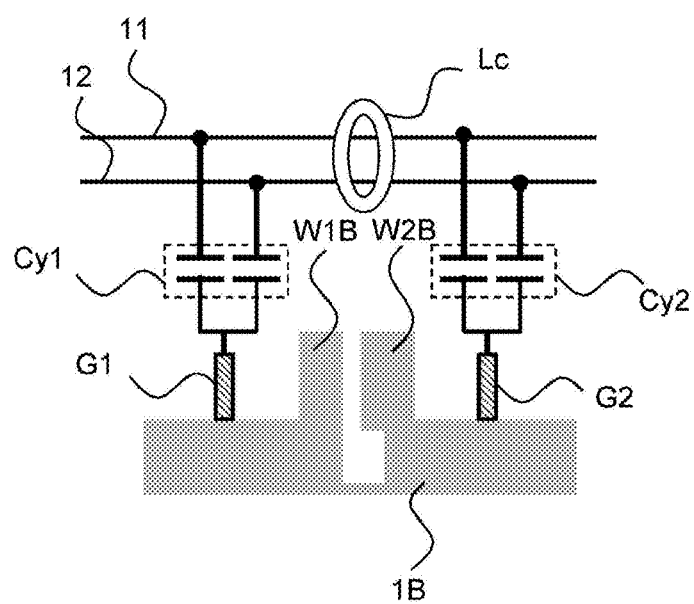
FIG. 8 is a diagram illustrating a structure of a π-type noise filter according to a third embodiment of the present invention.

In FIG. 8, surfaces of a first partition W1B and a second partition W2B oppose each other, and a part of the surfaces protrudes. As seen here, as long as the surfaces of these partitions opposing each other have areas equal to each other, the surfaces are as effective, regardless of shapes of the surfaces. Accordingly, in FIG. 8, a partially protruding portion is bent at 90 degrees, but may be formed in any other shapes.

Figure 9:
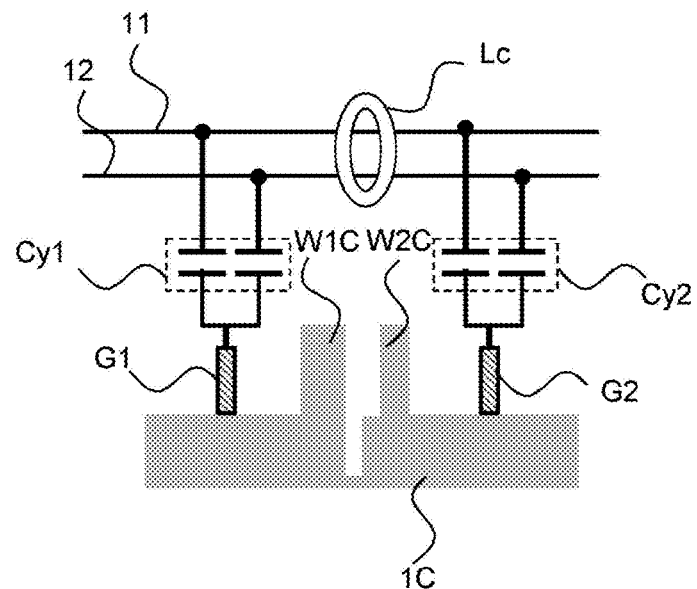
FIG. 9 is a diagram illustrating a structure of a π-type noise filter according to a fourth embodiment of the present invention.
Figure 10:
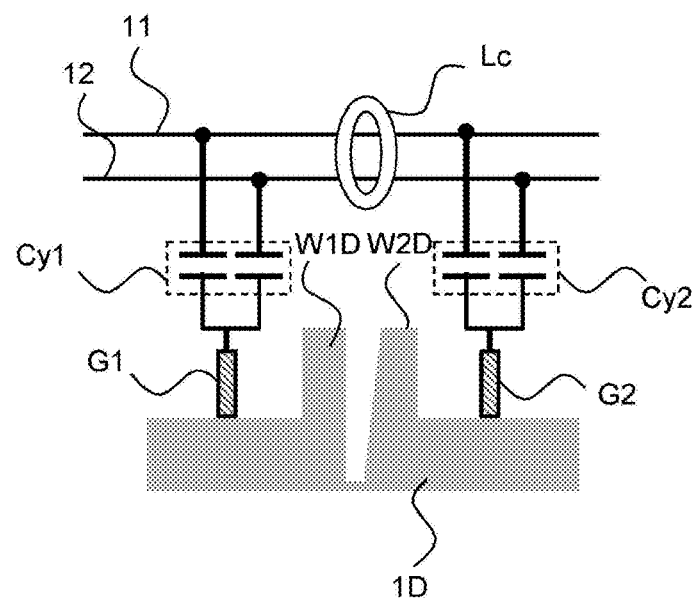
FIG. 10 is a diagram illustrating a structure of a π-type noise filter according to a fifth embodiment of the present invention.

For example, as illustrated in FIG. 9, a first partition W1C and a second partition W2C may have different thicknesses, while arranged as parallel plates that are parallel to each other. Alternatively, these partitions may be arranged in a curved shape. Still alternatively, these partitions may not necessarily be arranged parallel to each other. As long as a desired capacitance is obtained, as illustrated in FIG. 10, any one of a first partition W1D and a second partition W2D opposing each other may have an inclined surface.

Figure 11:
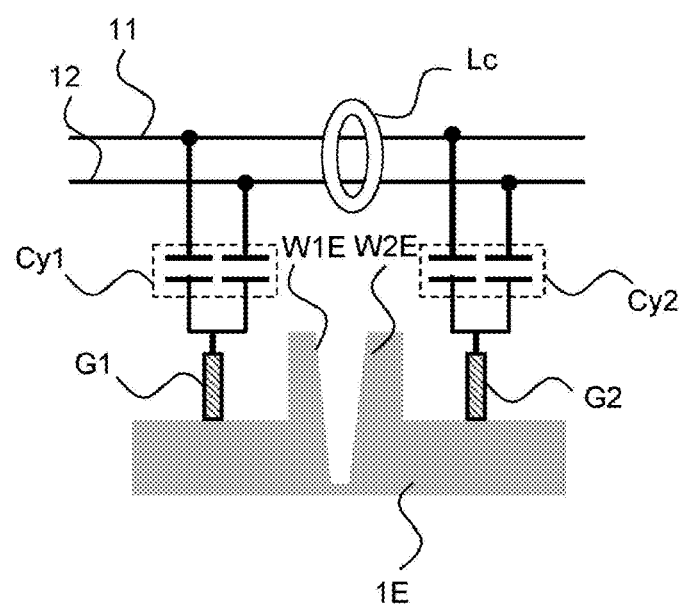
FIG. 11 is a diagram illustrating a structure of a π-type noise filter according to a sixth embodiment of the present invention.

Still further alternatively, as illustrated in FIG. 11, a first partition W1E and a second partition W2E may have surfaces that oppose each other and have tapered shapes. In this case, when the partitions W1E and W2E are formed by casting, the mold is removed such that draft angles of the partitions W1E and W2E are maintained. Then, the partitions W1E and W2E result in the tapered shape.

The configurations in the third to sixth embodiments of the present invention described above are effective as follows.
(4) In the filter device, the first partitions W1B to W1E each have a surface opposing a surface of each of the second partitions W2B to W2E, the surfaces having areas equal to each other. This configuration allows more freedom of design in manufacturing of the partitions.

Note that, the foregoing embodiments are to be considered in all respects as merely illustrative and not restrictive. Thus, the scope of the invention is defined by the appended claims rather than the foregoing embodiments. For example, in the foregoing embodiments, the power conversion device is mounted in a vehicle such as a hybrid automobile or an electric automobile, but the present invention is not limited thereto. The power conversion device may alternatively be used in a construction machine, a railway vehicle, or others. Thus, any change, addition, or deletion of a configuration of each unit appropriately made within the technical concept of the invention will naturally fall within the scope of claims of the present invention.

REFERENCE SIGNS LIST 1 power conversion device (inverter)
2 high voltage battery
3 line impedance stabilization network (LISN) of high voltage power supply
31 positive electrode LISN circuit unit
32 negative electrode LISN circuit unit
4 high voltage DC cable
5 high voltage AC cable
6 electric motor
6-U U-phase coil
6-V V-phase coil
6-W W-phase coil
6-Cs stray capacitance between coil and housing
7 insulator
8 GND strap
9 GND plane
11 positive electrode wiring as DC wiring
12 negative electrode wiring as DC wiring
13 π-type noise filter
14 switching circuit
1-Cs stray capacitance between switching circuit and housing
100 dielectric
SW1 to SW3 unit switching circuit
TR1, TR2 insulated gate bipolar transistor
D1, D2 diode
Cx smoothing capacitor
Lc magnetic core
Cy1 first ground capacitor
Cy2 first ground capacitor
Cy11, Cy21 ground capacitor between positive electrode wiring as DC wiring and housing
Cy12, Cy22 ground capacitor between negative electrode wiring as DC wiring and housing
G1 first ground point
G2 second ground point
BSB direct current wiring
W1 to W3 partition

The invention claimed is:

1. A filter device comprising:
a π-type noise filter; and
a metal case for eclosing the π-type noise filter therein, and in which a first ground point and a second ground point are formed;
wherein:
the π-type noise filter includes: a magnetic core configured to surround a direct current wiring including a positive electrode wiring and a negative electrode wiring; a first capacitor disposed in a stage preceding the magnetic core and connected to the direct current wiring; and a second capacitor disposed in a stage subsequent to the magnetic core and connected to the direct current wiring, each of the first capacitor and the second capacitor connected to a corresponding one of the first ground point and the second ground point,
a first partition and a second partition are interposed between the preceding stage and the subsequent stage of the π-type noise filter in the metal case, and
a first surface of the first partition opposes a first surface of the second partition across a predetermined gap, a second surface of the first partition opposes the first ground point, and a second surface of the second partition opposes the second ground point.

2. The filter device according to claim 1, comprising an insulation member disposed within the predetermined gap between the first partition and the second partition.

3. The filter device according to claim 1, wherein the first surfaces of the first and second partitions having areas equal to each other.

4. A power conversion device comprising:
the filter device according to claim 1; and
a power conversion unit configured to convert a direct current voltage from the filter device to an alternating current voltage.

* * * * *